United States Patent
Kapre et al.

(10) Patent No.: US 6,747,318 B1
(45) Date of Patent: Jun. 8, 2004

(54) BURIED CHANNEL DEVICES AND A PROCESS FOR THEIR FABRICATION SIMULTANEOUSLY WITH SURFACE CHANNEL DEVICES TO PRODUCE TRANSISTORS AND CAPACITORS WITH MULTIPLE ELECTRICAL GATE OXIDES

(75) Inventors: Ravindra M. Kapre, San Jose, CA (US); Tommy Hsiao, San Francisco, CA (US); Yanhua Wang, San Jose, CA (US); Kyungjin Min, Sunnyvale, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/020,304

(22) Filed: Dec. 13, 2001

(51) Int. Cl.$^7$ ............................................... H01L 29/94
(52) U.S. Cl. ....................... 257/368; 257/296; 257/300; 257/392; 257/403; 257/532
(58) Field of Search ................................ 257/296, 300, 257/368, 392, 403, 407, 412, 532

(56) References Cited

U.S. PATENT DOCUMENTS

| | | | | |
|---|---|---|---|---|
| 4,302,764 A | * | 11/1981 | Fang et al. ..................... | 357/23 |
| 5,032,786 A | * | 7/1991 | Kimura ........................ | 324/158 |
| 5,208,473 A | * | 5/1993 | Komori et al. .............. | 257/345 |
| 5,523,603 A | * | 6/1996 | Fishbein et al. ............ | 257/356 |
| 5,605,861 A | * | 2/1997 | Appel .......................... | 437/164 |
| 5,616,948 A | * | 4/1997 | Pfiester ....................... | 257/412 |
| 5,688,722 A | * | 11/1997 | Harrington, III ............ | 438/217 |
| 5,767,557 A | * | 6/1998 | Kizilyalli .................... | 257/403 |
| 5,998,828 A | * | 12/1999 | Oeno et al. .................. | 257/315 |
| 6,066,880 A | * | 5/2000 | Kusunoki .................... | 257/379 |
| 6,207,510 B1 | * | 3/2001 | Abeln et al. ................. | 438/276 |

(List continued on next page.)

FOREIGN PATENT DOCUMENTS

| | | | |
|---|---|---|---|
| EP | 422129 | * | 9/1997 |
| JP | 2-280381 | * | 11/1990 |
| JP | 7-273212 | * | 10/1995 |
| JP | 7-321220 | * | 12/1995 |
| JP | 9-321276 | * | 12/1997 |
| JP | 2001-85533 | * | 3/2001 |

Primary Examiner—Nathan J. Flynn
Assistant Examiner—Ahmed N. Sefer
(74) Attorney, Agent, or Firm—Beyer Weaver & Thomas LLP

(57) ABSTRACT

A method for fabricating buried channel NMOS devices and the devices themselves are disclosed. These buried channel NMOS devices are fabricated with a p-type substrate, an n-type implant in the top portion (approximately 400 to 1000 Å deep) of the substrate, and an insulating gate dielectric above the n-type implant. An n-type or p-type doped polysilicon gate electrode is formed on top of the insulating gate dielectric. The n-type implant region is doped in such a way that it is depleted of charge carriers when the device's gate electrode is at the same potential as the well (zero bias). When the gate electrode is biased $+V_e$ with respect to the device's well substrate a conducting channel of mobile electrons is formed in a portion of the buried layer. This type of biasing is known as inversion bias since the charge carriers are of the opposite type than the p-well. Under inversion bias, the buried channel silicon region is partially depleted of charge carriers, which effectively adds to the thickness of the gate dielectric layer. A capacitor or transistor fabricated according to this buried channel teaching behaves in a manner electrically equivalent to a capacitor or transistor fabricated with a thicker dielectric. PMOS transistors and capacitors can be constructed according to the present invention in a manner similar to that described for NMOS transistors and capacitors by substituting n-type doping for p-type and visa versa. This leads to the fabrication of CMOS devices with multiple effective dielectric thicknesses on the same substrate.

11 Claims, 9 Drawing Sheets

U.S. PATENT DOCUMENTS

| | | | |
|---|---|---|---|
| 6,221,703 B1 * | 4/2001 | Liu et al. | 437/174 |
| 6,222,234 B1 * | 4/2001 | Imai | 257/347 |
| 6,245,607 B1 * | 6/2001 | Tang et al. | 438/217 |
| 6,285,052 B1 * | 9/2001 | Draper | 257/300 |
| 6,373,102 B1 * | 4/2002 | Huang | 257/345 |
| 6,436,749 B1 * | 8/2002 | Tonti et al. | 438/199 |
| 6,462,379 B2 * | 10/2002 | Higashi et al. | 257/347 |
| 6,555,446 B1 * | 4/2003 | Unnikrishnan | 438/459 |
| 6,593,799 B2 * | 7/2003 | De et al. | 327/534 |
| 2002/0058424 A1 * | 5/2002 | Rotondaro | 438/774 |

* cited by examiner

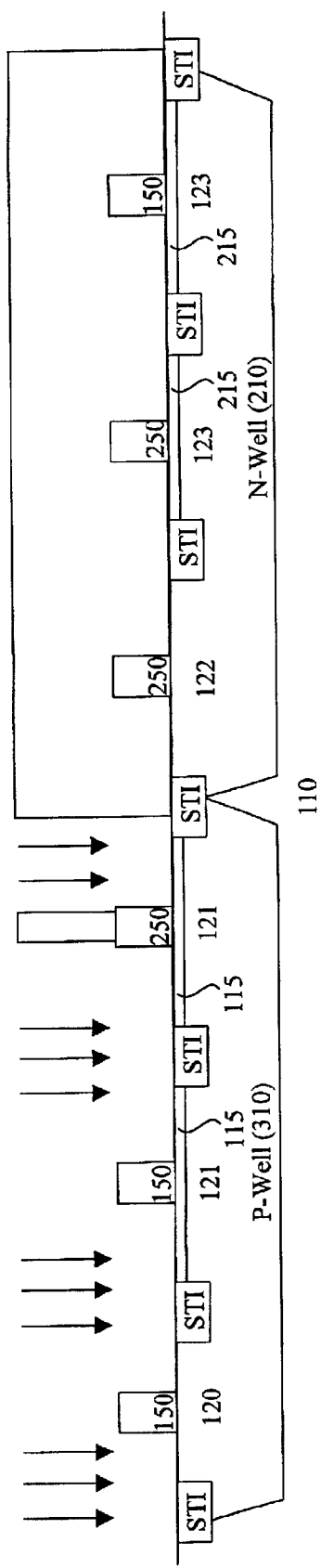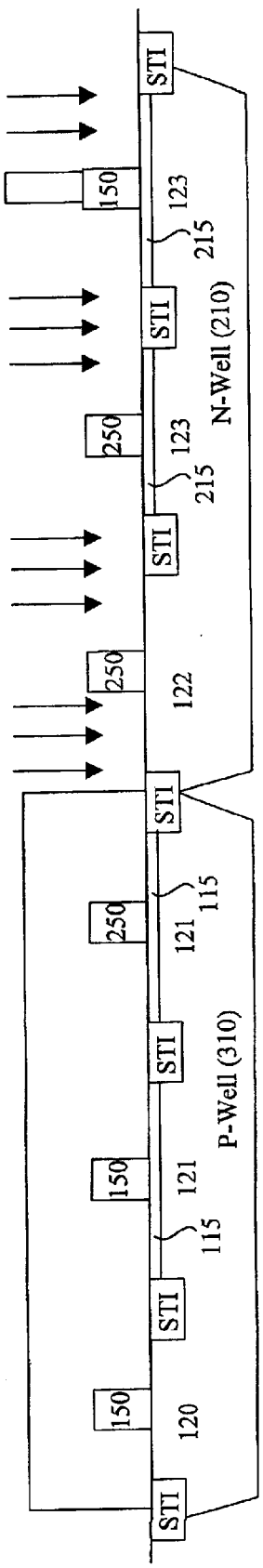
FIG. 7
FIG. 8

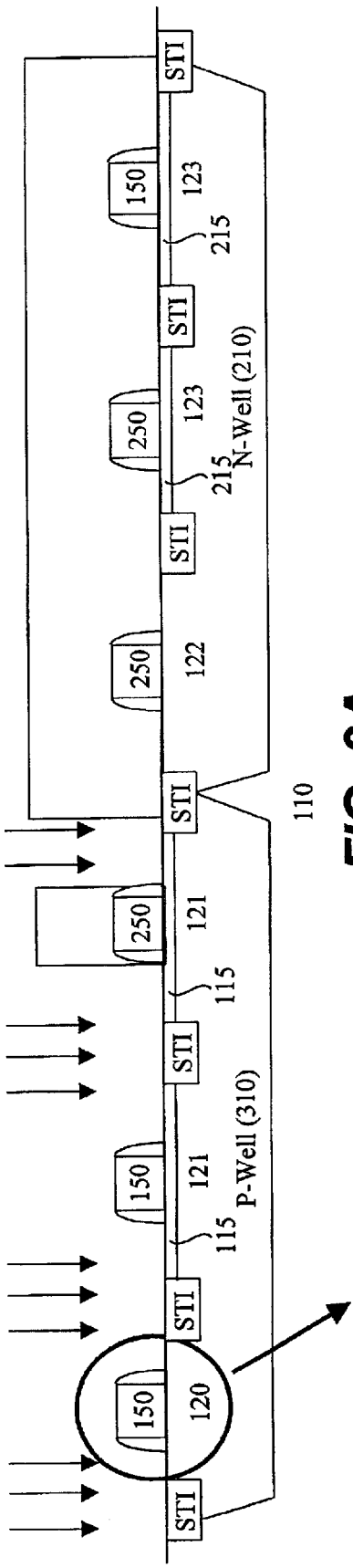
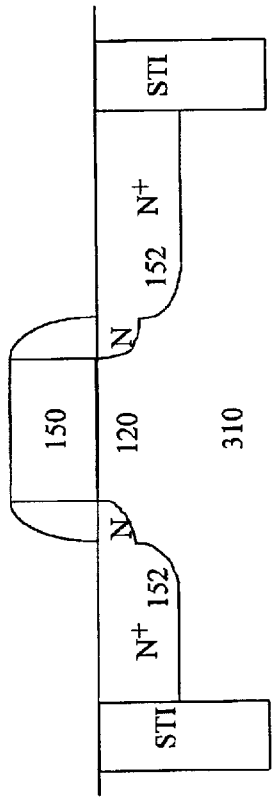
FIG. 9A
FIG. 9B

FIG. 11A *(Prior Art)*

BURIED CHANNEL DEVICES AND A PROCESS FOR THEIR FABRICATION SIMULTANEOUSLY WITH SURFACE CHANNEL DEVICES TO PRODUCE TRANSISTORS AND CAPACITORS WITH MULTIPLE ELECTRICAL GATE OXIDES

FIELD OF THE INVENTION

The present invention relates generally to integrated circuits (ICs) and the methods for fabricating them on semiconductor substrates. More specifically, the present invention relates to devices having a buried channel fabricated on a semiconductor substrate and methods for fabricating them.

BACKGROUND OF THE INVENTION

Integrated circuits (ICs) are ubiquitous in products ranging from personal computers to portable digital assistants ("PDAs") to cellular telephones. As the functional boundaries between different products have gradually blurred, with portable telephones now providing internet access and PDAs also functioning as global positioning system receivers, the complexity of the ICs in these products has increased at a nearly exponential rate. Often, a single IC must operate at high speed, use little power, have a high level of circuit density and, in many cases, also have both analog and digital functions incorporated into it.

As the number of functions performed by these "systems-on-a-chip" has increased, the number of different devices that must be fabricated on the same semiconductor substrate has also increased, such devices including multiple types of transistors and low leakage capacitors. Each different device that must be fabricated on the same IC complicates the already complicated semiconductor processing flow. One particular problem of fabricating so many different devices on the same IC at the same time is that the different devices need gate oxides of different thickness.

Although the formation of oxides, particularly silicon dioxide, in silicon semiconductor processing is well known and technically straightforward, fabricating oxides of different thickness on the same semiconductor wafer during processing is difficult. One known method for fashioning oxides of different thickness is known as "grow-etch-grow." In this method, a first gate oxide layer is grown on a semiconductor wafer. The wafer is then masked in a known manner and the first layer gate oxide is etched away from certain areas. The mask is then stripped and a second, additional oxide layer is grown on the wafer. The cycle is repeated until the different oxide layers have reached their desired thickness.

For the particular device known as a 1-T random access memory ("RAM"), wherein a capacitor stores an individual bit of data, the capacitors are fabricated using a poly-insulator-poly ("PIP") process. The PIP method fabricates capacitors by etching an additional trench within the shallow trench isolation ("STI") region of the wafer. A first polysilicon layer is deposited in the additional trench. A dielectric layer is then formed, followed by as many additional trenches, polysilicon and dielectric layers as necessary. This succession of layers forms the desired capacitor.

Both methods have significant drawbacks. Each oxide growth cycle is charged against the process temperature budget, as oxide growth requires relatively high temperatures that affect concentrations of implanted dopants in other regions of the wafer. Every additional process step increases fabrication costs both directly and indirectly, as manufacturing yield declines with each additional manufacturing step.

Particularly as semiconductor processing technology moves to sub-180 nanometer (nm) technologies, there is a need to create devices on the same wafer with different effective oxide thickness without increasing the number of process steps overall.

SUMMARY OF THE INVENTION

In a first embodiment of the present invention, buried channel NMOS devices are fabricated. These buried channel NMOS devices are fabricated with a p-type substrate, an n-type implant in the top portion (approximately 400 to 1000 Å deep) of the substrate, and an insulating gate dielectric above the n-type implant. An n-type or p-type doped polysilicon gate electrode is formed on top of the insulating gate dielectric. The n-type implant region is doped in such a way that it is depleted of charge carriers when the device's gate electrode is at the same potential as the well (zero bias). When the gate electrode is biased $+V_e$ with respect to the device's well, a conducting channel of mobile electrons is formed in a portion of the buried layer. This type of biasing is known as inversion bias as the charge carriers are of the opposite type than the p-well. Under inversion bias, the buried channel silicon region is partially depleted of charge carriers, which effectively adds to the thickness of the gate dielectric layer. A capacitor or transistor fabricated according to this buried channel teaching behaves in a manner electrically equivalent to a capacitor or transistor fabricated with a thicker dielectric.

By using both conventional devices and devices incorporating the buried channel of the present invention on the same IC, effective additional dielectric thickness is obtained without the need to physically grow a thicker dielectric. The thicker dielectric created by the buried channel also reduces the amount of current leakage between the gate electrode and the substrate in capacitors, which is a significant problem when dielectric thickness is less than or equal to about 22 Å. The reduced leakage makes buried channel capacitors very useful for such applications as filter capacitors in phase locked loops ("PLLs"), storage capacitors for 1-transistor RAM (1-T RAM) and voltage stabilizing on-chip capacitors.

PMOS transistors and capacitors can be constructed according to the present invention in a manner similar to that described for NMOS transistors and capacitors by substituting n-type doping for p-type and visa versa. This leads to the fabrication of CMOS devices with multiple effective dielectric thicknesses on the same substrate.

By greatly reducing the number of extra oxidation steps necessary to create a dielectric layer of desired thickness, the present invention reduces process cost, increases process yield and reduces process temperature, which is a great advantage with respect to sub-180 nm technologies brief description of the drawings

BRIEF DESCRIPTION OF THE DRAWINGS

The invention, together with further advantages thereof, may best be understood by reference to the following description taken in conjunction with the accompanying drawings in which:

FIG. 7 is a cross-sectional drawing of the semiconductor wafer shown in FIG. 6, undergoing a further step in its processing;

FIG. 8 is a cross-sectional drawing of the semiconductor wafer shown in FIG. 7, undergoing a further step in its processing;

FIGS. 9a and 9b are, respectively, a cross-sectional drawing of the semiconductor wafer shown in FIG. 8 undergoing a further step in its processing and a detail of one device created by the previously illustrated processing steps;

FIGS. 11a and 11b are cross-sectional drawings of, respectively, a known NMOS transistor and a known MOS capacitor and an NMOS transistor and MOS capacitor fabricated according to an embodiment of the present invention.

Use of the same reference number in different figures indicates similar or like elements.

DETAILED DESCRIPTION OF THE INVENTION

Reference will now be made in detail to some presently preferred embodiments of the invention. Examples of preferred embodiments are illustrated in the accompanying drawings. While the invention will be described in conjunction with these preferred embodiments, it will be understood that it is not intended to limit the invention to any particular preferred embodiment. On the contrary, it is intended to cover alternatives, modifications and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Figure 1:
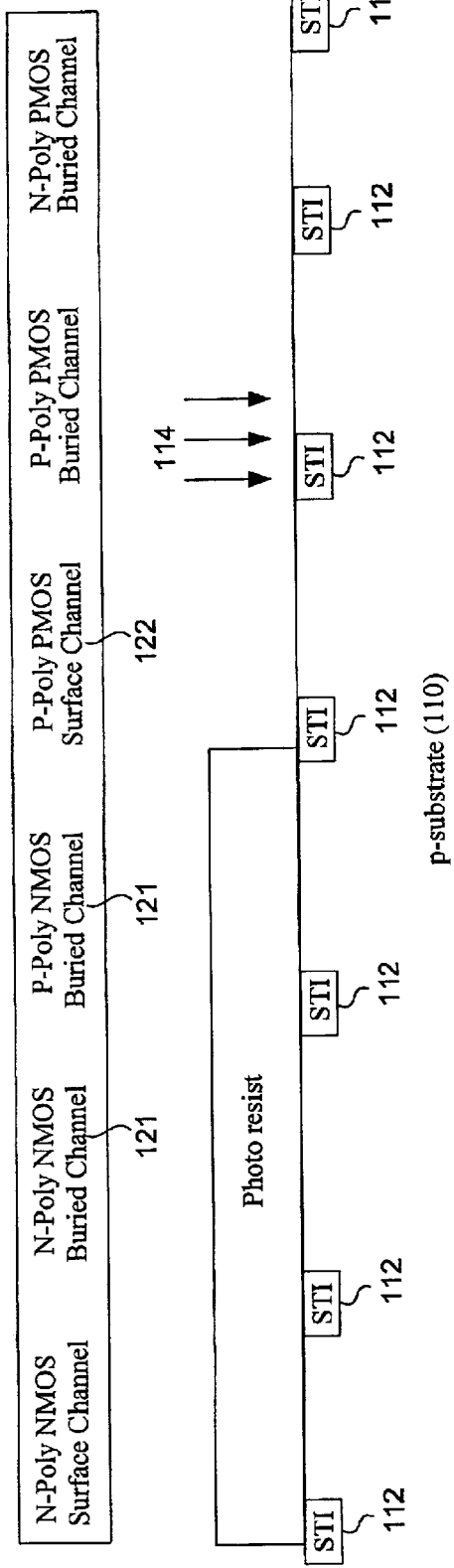
FIG. 1 is a cross-sectional drawing of a semiconductor wafer at the beginning of processing, according to a first embodiment of the present invention.

Fabrication of both N- and P-type buried channel and surface channel devices can be accomplished almost simultaneously. FIG. 1 shows a cross-section of a semiconductor wafer at the beginning of the process used to fabricate devices according to an embodiment of the present invention. P-type substrate 110 has undergone an initial process step to create a plurality of shallow trench isolation (STI) regions 112 in substrate 110. STIs 112 serve to isolate completed devices electrically. A photo-resist is applied to the substrate and then a mask step follows. After removal of the photo-resist from unmasked areas of substrate 110, an N-type well is created by implanting, in this embodiment, phosphorus at an energy level in the range of 200–300 KeV and a doping dose of 5 to $10*10^{12}/cm^2$. Arrows 114 indicate the location of the N-type well implant.

Figure 2:
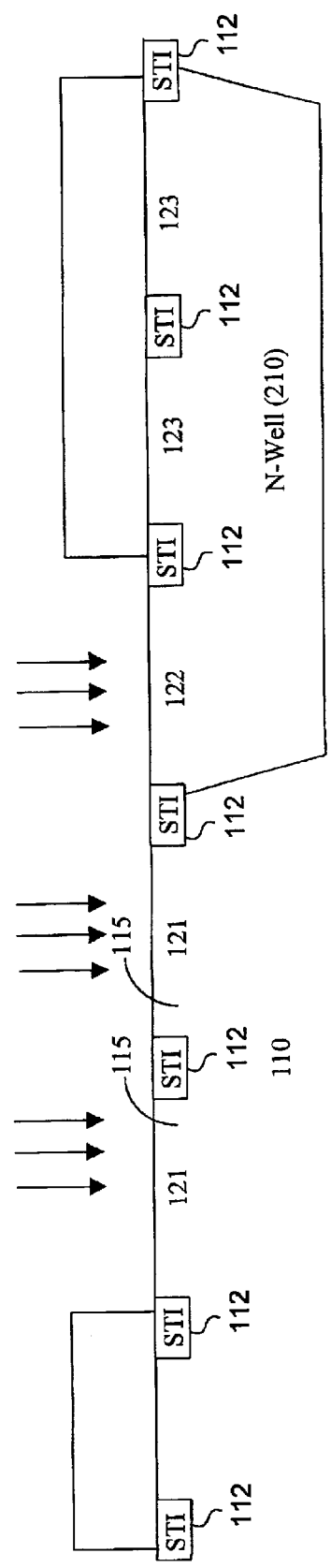
FIG. 2 is a cross-sectional drawing of the semiconductor wafer shown in FIG. 1, undergoing a further step in its processing.

After the N-type well implant, the remaining photo-resist is removed and the wafer again covered with a photo-resist, which is then masked and selectively removed. As shown in FIG. 2, N-type well 210 is now defined within substrate 110. NMOS buried channel devices 121 and PMOS surface channel devices 122 now receive an n-type implant 115. In this embodiment the n-type implant comprises arsenic at an energy level in the range of 100 to 150 KeV and a dose of 1 to $5*10^{12}/cm^2$. This n-type implant 115 for NMOS devices is opposite to the p-type substrate of these devices. It is this implant 115 that ultimately comprises the buried channel in the finished devices.

Figure 3:
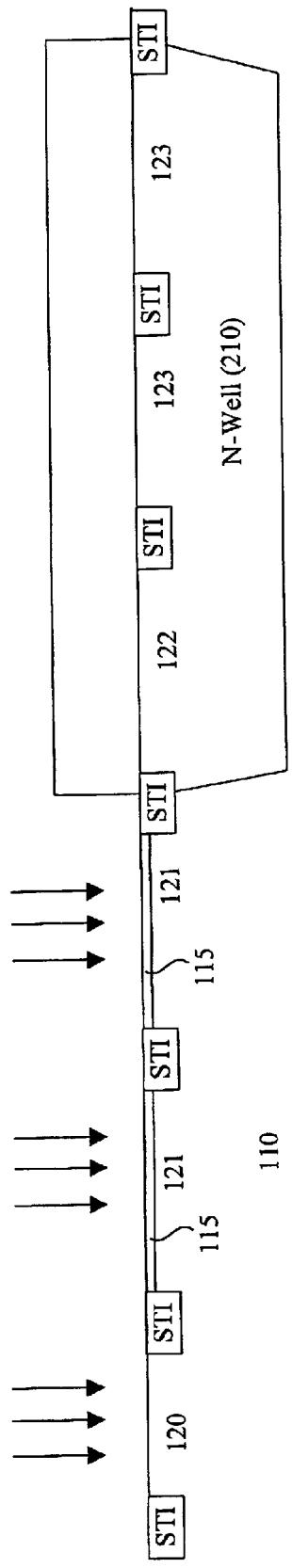
FIG. 3 is a cross-sectional drawing of the semiconductor wafer shown in FIG. 2, undergoing a further step in its processing.

After again stripping off the residual photo-resist, reapplying photo-resist and again masking the wafer, wafer 100 appears as shown in FIG. 3. A p-type well is now created in p-type substrate 110 for all NMOS devices, including both surface channel devices 120 and buried channel devices 121. In this embodiment, the p-type well is created using boron at an energy level of 80 to 120 KeV and a dose level of 4 to $8*10^{12}/cm^2$. P-type well 310 is illustrated in FIG. 4.

Figure 4:
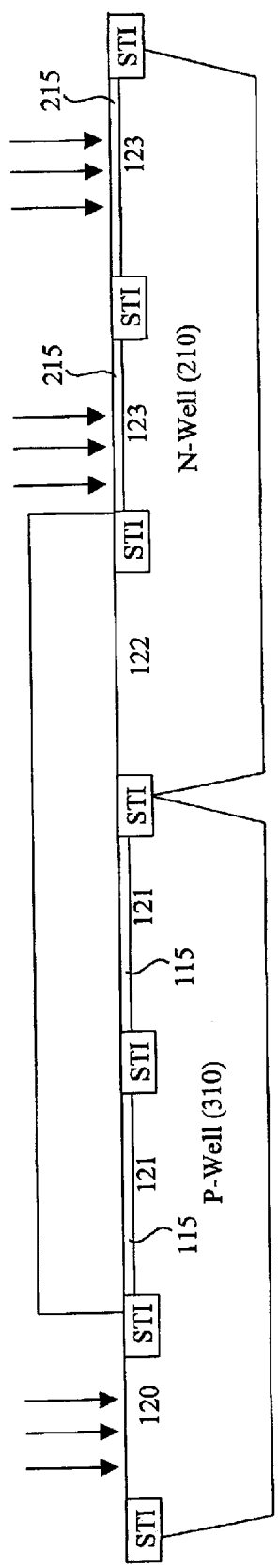
FIG. 4 is a cross-sectional drawing of the semiconductor wafer shown in FIG. 3, undergoing a farther step in its processing.

As is also shown in FIG. 4, residual photo-resist has again been removed, followed by a new coat of photo-resist and another masking operation. PMOS buried channel devices 123 and NMOS surface channel devices 120 now receive a p-type implant 215. This p-type implant uses boron at an energy level of 10 to 25 KeV and a dose level of 1 to $5*10^{12}/cm^2$. This p-type implant 215 for PMOS devices is opposite to its n-type well 210, thereby forming the buried channel portion of the finished device.

Figure 5:
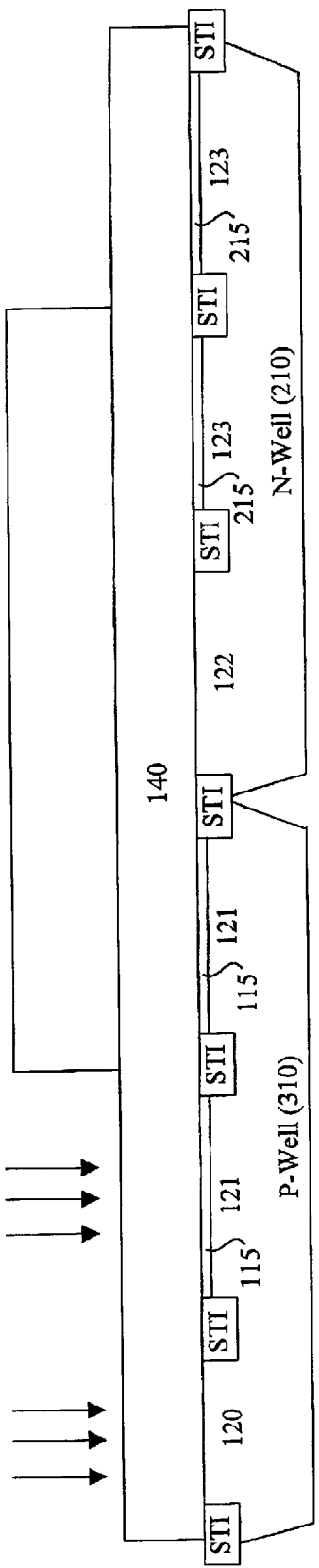
FIG. 5 is a cross-sectional drawing of the semiconductor wafer shown in FIG. 4, undergoing a further step in its processing.

Continuing the processing of wafer, residual photo-resist is removed from the wafer. As shown in FIG. 5, a gate oxide is grown and a polysilicon layer 140 is deposited on wafer 100. A photo-resist is then deposited on top of polysilicon layer 140 and masked. An n-type impurity is now implanted into NMOS surface channel devices 120 and NMOS "regular gate" buried channel devices 121, as well as into PMOS "swapped gate" buried channel devices 123. A "regular gate" device is one in which the gate doping is of the opposite type than the well, e.g. an N-type doped gate on a p-type well substrate. A "swapped gate" device is one which has the same type of polysilicon gate implant impurity as that of the device's well. In this embodiment, the n-type impurity is phosphorus, implanted with an energy of 25 to 40 KeV and a dose of 3 to $6*10^{15}/cm^2$.

Figure 6:
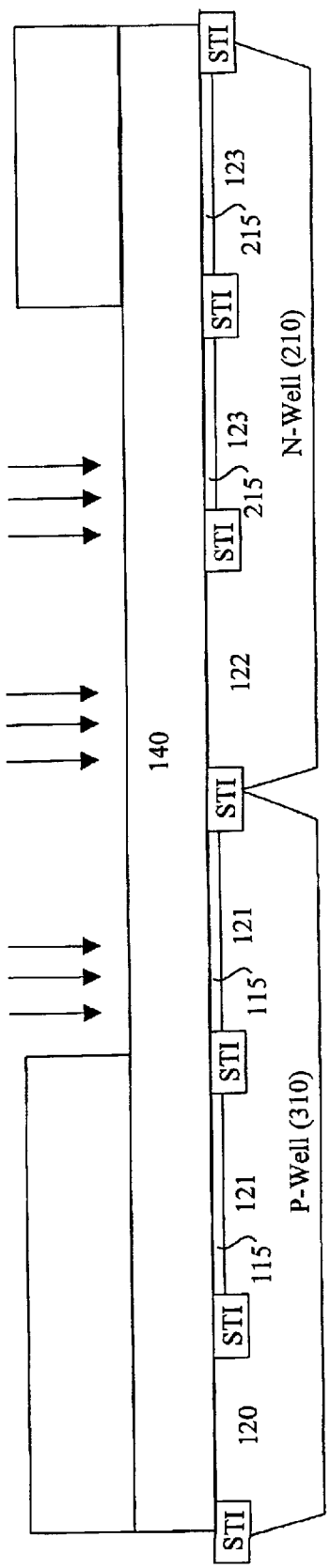
FIG. 6 is a cross-sectional drawing of the semiconductor wafer shown in FIG. 5, undergoing a further step in its processing.

As shown in FIG. 6, those areas of the wafer that did not receive the n-type implant as shown in FIG. 5 will receive, after the residual photo-resist is stripped off, another coat of photo-resist applied and the new photo-resist masked as necessary, a p-type impurity implant into p-type polysilicon NMOS buried channel device 121, PMOS surface channel devices 122 and p-type polysilicon PMOS buried channel devices 123. In this embodiment, the p-type implant comprises $BF_2$ at an energy level of 20 to 35 KeV and a dose of 1 to $3*10^{15}/cm^2$.

After the implants shown in FIGS. 5 and 6, residual photo-resist is again removed from the wafer, another coat of photo-resist applied and another mask operation performed on the photo-resist layer. After this masking operation, an etching operation removes most of polysilicon layer 140, except n-type gates 150 and p-type gates 250, as shown in FIG. 7. After this selective removal of the polysilicon layer, residual photo-resist is removed and a new layer of photo-resist deposited masked and then selectively removed. Again as shown in FIG. 7, through those areas exposed after the removal of the photo-resist, an n-type lightly doped drain (NLDD) implant goes to the active areas of all NMOS devices 120 and 121, as well as the polysilicon gates 150 of n-polysilicon NMOS surface channel device 120 and n-polysilicon NMOS buried channel device 121. This NLDD implant uses, in this embodiment, arsenic at an energy level of 3 to 7 KeV and a dose of 0.5 to $1.5*10^{15}/cm^2$.

In a very similar fashion, a p-type lightly doped drain (PLDD) implant goes to the active areas of all PMOS devices 122 and 123, as well as to the polysilicon gates 250 of p-polysilicon PMOS surface channel devices 122 and p-polysilicon PMOS buried channel devices 123. This implant step is shown in FIG. 8. This PLDD implant uses $BF_2$ at an energy level of 3 to 7 KeV and a dose of 1 to $4*10^{14}/cm^2$. The same series of steps of stripping residual photo-resist, applying a new coat of photo-resist and then masking and developing the exposed photo-resist occur before the PLDD implant as they did before the NLDD implant.

Following the NLDD and PLDD implants shown respectively in FIGS. 7 and 8 dielectric spacers are defined on the sides of the polysilicon gates as shown in FIG. 9a. Then n-type dopant will be implanted into the source and drain areas 152 of NMOS devices 120 and 121, as well as the polysilicon gates 150 of n-type polysilicon NMOS surface channel devices 120 and n-type polysilicon NMOS "regular gate" buried channel devices 121. A photoresist coat, masking and developing step was applied to the wafer prior to this implant. The process step is shown in FIG. 9a. The n-type dopant in this embodiment is arsenic at an energy level of 40 to 70 KeV and a dose of 2 to $4*10^{15}/cm^2$. A cross section of a completed n-type polysilicon NMOS surface channel device is shown in FIG. 9b, wherein source/drain areas 152 have an N+ dopant concentration and a surface channel lies directly below gate 150.

Figure 10A:
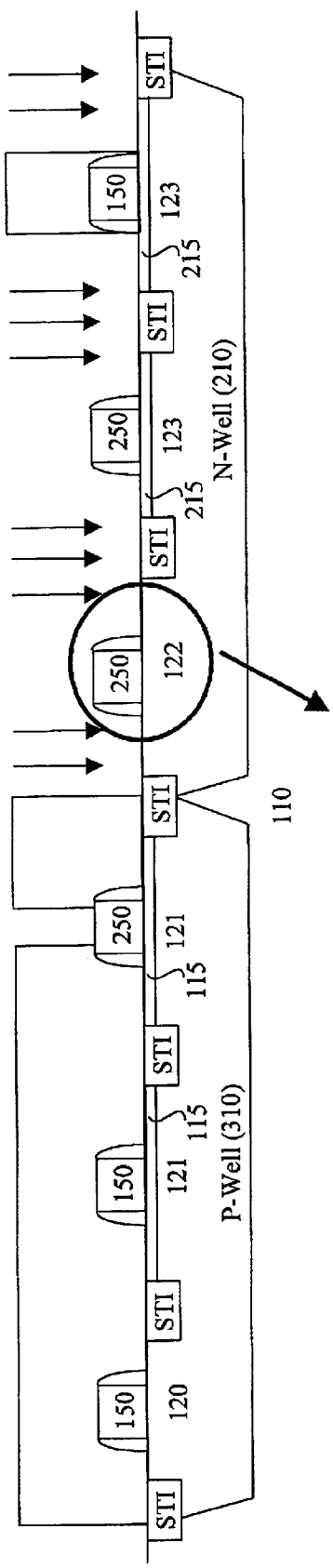
FIGS. 10a and 10b are, respectively, a cross-sectional drawing of the semiconductor wafer shown in FIG. 9a undergoing a further step in its processing and a detail of one device created by the previously illustrated processing steps.
Figure 10B:
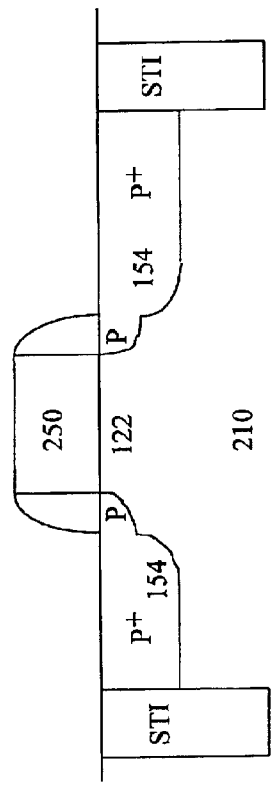

As shown in FIG. 10a, a similar dopant implant operation is required for the PMOS surface channel devices 122 and buried channel devices 123. After removing the residual photo-resist, another photo-resist layer is applied, masked and developed. A p-type dopant is implanted in the source and drain areas 154 of PMOS surface channel devices 122 and PMOS buried channel devices 123 as well as in the polysilicon gates 250 of PMOS surface channel devices 122 and "regular gate" buried channel devices 123. This same implant goes to polysilicon gate 250 of "swapped gate" buried channel NMOS devices 121. In this embodiment, the p-type dopant comprises $BF_2$ at an energy level of 20 to 35 KeV and a dose of 2 to $4*10^{15}/cm^2$. A cross section of a completed P-polysilicon PMOS surface channel device is shown in FIG. 10b, wherein source/drain areas 154 have an p+ dopant concentration and a surface channel lies directly below gate 250. In another embodiment of the "swapped gate", the buried channel NMOS device receives only this p-type implant with no need for the P-Poly implant shown in FIG. 6.

FIG. 11a shows a cross-section of a known surface channel NMOS transistor 5 and a known MOS capacitor 50. In transistor 5, a p-type substrate 10 is implanted with p-type dopants to form region 20, which region adjusts transistor 5's operating threshold. An insulating gate dielectric 30 is formed above region 20 and a n-type doped polysilicon gate electrode 40 is formed on top of dielectric 30. Source and drain regions 25 complete transistor 5. MOS capacitor 50 is constructed in an identical fashion, with the exception of source and drain regions 25 and doped polysilicon gate electrode 40. In another embodiment of the present invention, the fabrication process would result in the MOS capacitors having source and drain regions around them. In this embodiment, the source and drains would be electrically tied to the capacitor's well.

Figure 11B:
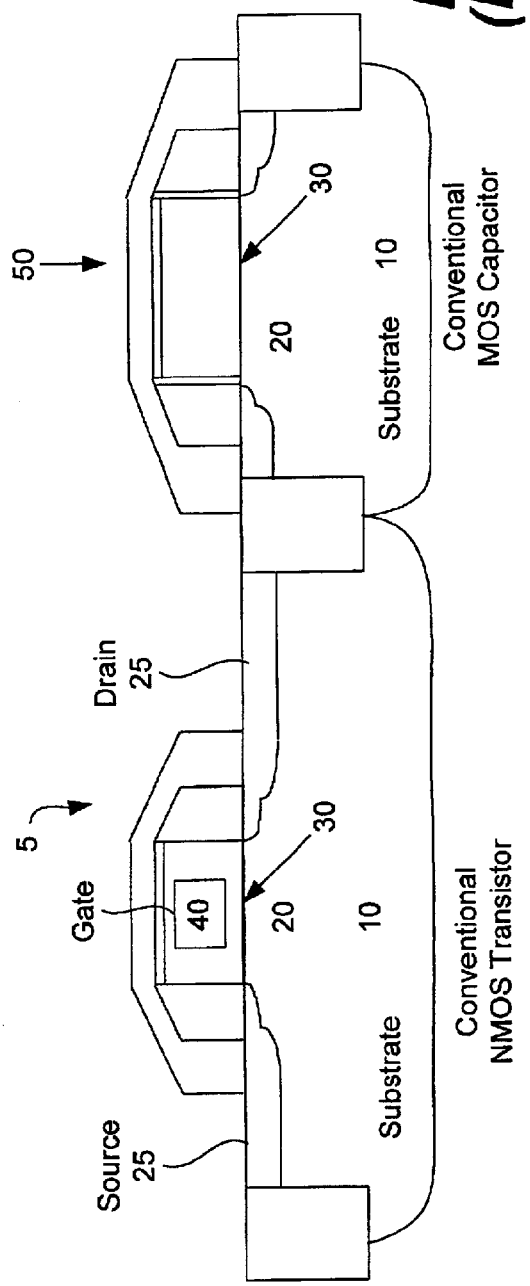
Figure 11B:
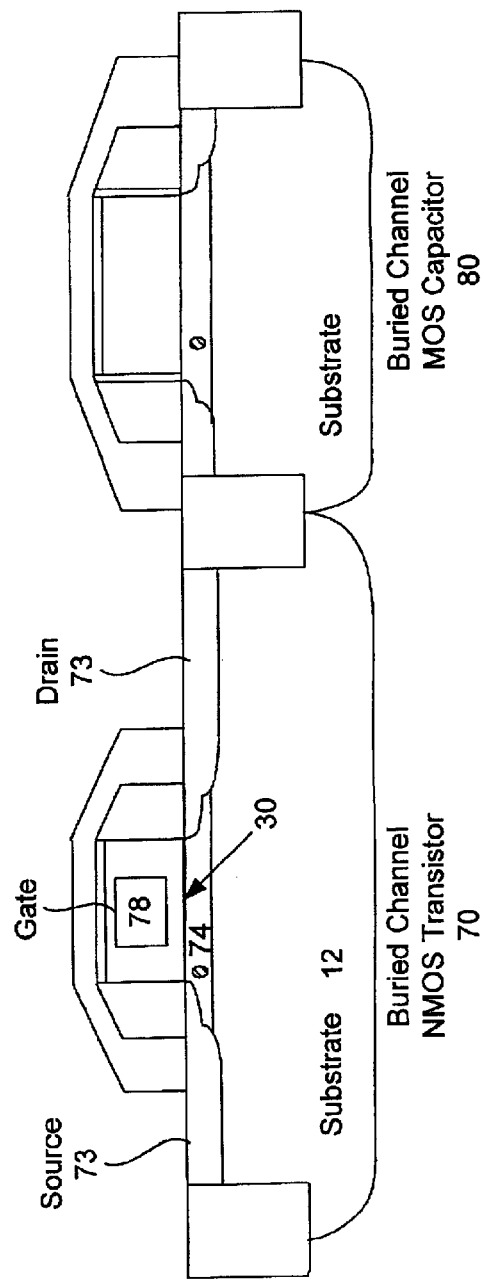

A cross-section of a buried channel NMOS transistor 70 and buried channel MOS capacitor 80, constructed according to an embodiment of the present invention, is shown in FIG. 11b. To form transistor 70, an n-type implant 74 of from 400 to 1000 Å in depth is formed in p-type substrate 72. Insulating gate dielectric 76 is formed over implant 74 and an n-type or p-type doped polysilicon gate electrode 78 is formed over gate dielectric 76. Drain and source 73 are formed on substrate 72 and complete transistor 70. MOS capacitor is formed in an identical manner to transistor 70, with the exception of source and drain 73 and gate electrode 78.

Figure 12A:
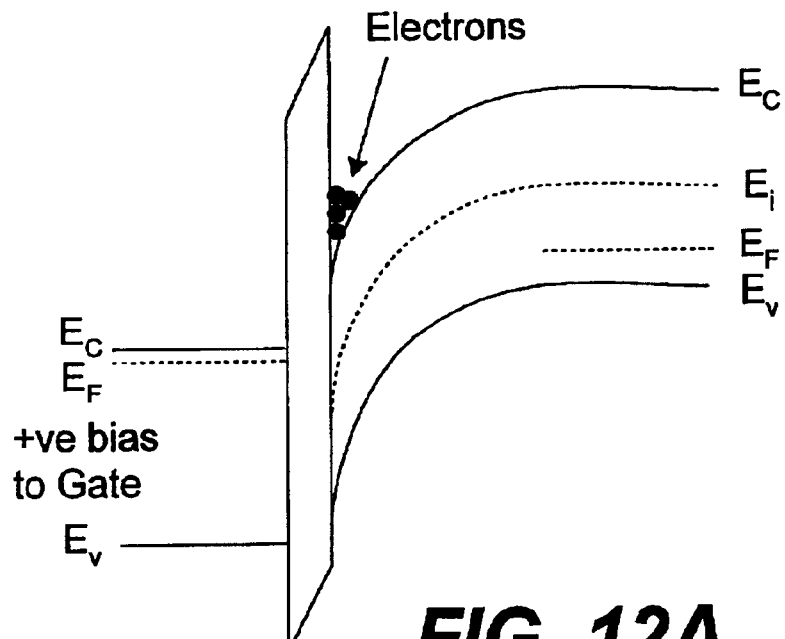
FIGS. 12a, 12b, and 12c are, respectively, electron band diagrams of a known surface channel device, a first buried channel device and a second buried channel device.
Figure 12B:
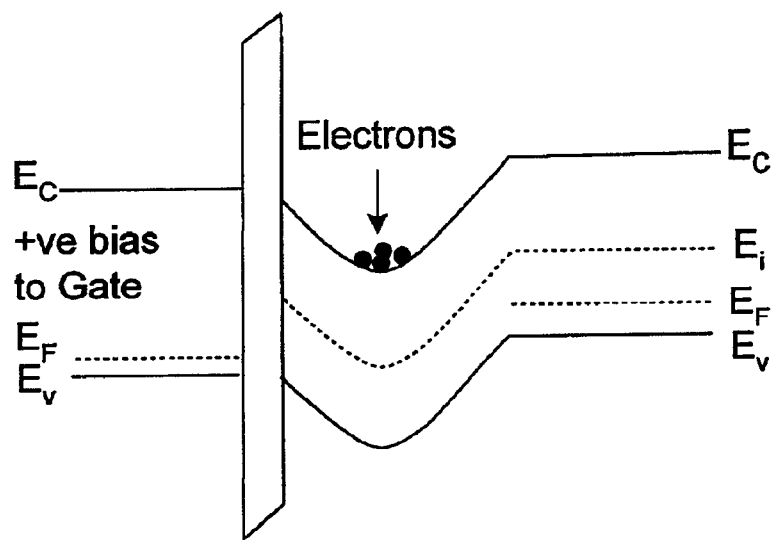
Figure 12C:
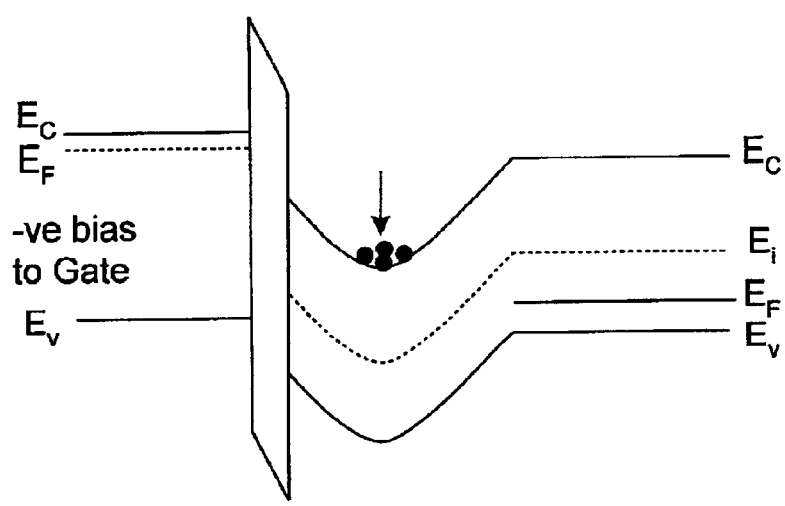

The n-type implant 74 is doped in such a way that it becomes depleted of charge carriers when gate electrode 78 is biased +Ve with respect to the substrate. This is also known as inversion bias. This silicon region, which is depleted of charge carries, thus adds to the gate dielectric thickness, effectively creating a thicker gate dielectric. FIGS. 12a, 12b and 12c present band diagrams from representative devices. FIG. 12a is a band diagram of a known surface channel device having an n-type gate, a +p-type channel and a +p-type substrate. Under inversion bias there is an increase in free electrons in the channel, resulting in the formation of a conducting channel. FIG. 12b is a band diagram of a buried channel device according to an embodiment of the present invention. The device has a p-type gate, an n-type channel and a p-type substrate. Under the same inversion bias that the known surface channel device shown in FIG. 12a was subjected to, the channel is depleted of charge carriers, effectively making the n-type channel region insulting and adding to the gate insulator thickness. FIG. 12c is a band diagram of a buried channel device constructed according to the present invention and differing from the device characterized in FIG. 12b only in that it has an n-type gate. Consequently, the bias is −Ve, not +Ve. The operation of the device and the effect of the channel in increasing the effective oxide thickness under the chosen operating conditions are identical.

By using conventional and buried channel devices on the same semiconductor die, additional dielectric thickness can be obtained without the necessity of physically growing an additional layer of dielectric material. The effectively thicker dielectric provided by the buried channel also reduces the amount of current leakage between the gate electrode and the substrate. Such leakage is a major problem when dielectric oxides thinner than or equal to about 22 Å are used. This reduced leakage current makes capacitors constructed with buried channels according to the present invention attractive for applications such as filter capacitors in phase locked loops (PLLs), storage capacitors for 1-transistor random access memories (RAM) and voltage stabilizing on-chip capacitors.

As shown in FIGS. 1 through 10b, PMOS and NMOS transistors and capacitors can readily be fabricated on the same semiconductor wafer without significantly increasing process complexity. These buried channel devices are constructed without adding any steps to the CMOS process flow. Buried channel NMOS devices use the same channel implant as the surface channel PMOS devices, namely an n-type dopant such as As or P. Thus, only the masks used in fabrication require modification. This is accomplished by opening an appropriate window in the mask artwork used for the channel implant. The buried channel PMOS devices use the same channel implant as the surface channel NMOS devices, primarily a p-type dopant such as boron. If the buried channel NMOS device needs to be constructed with a p-type gate doping, the p-type dopant of the surface channel PMOS gate device can be used by opening a window in the mask artwork used for this doping step. In a similar fashion, n-type gate doping for a buried channel PMOS device can be done with the n-type doping of surface channel NMOS devices. Using an embodiment of the present invention with standard CMOS process flow, NMOS and PMOS surface channel devices, NMOS buried channel devices with n-type gate doping, NMOS buried channel devices with p-type gate doping, PMOS buried channel devices with p-type gate doping and PMOS buried channel devices with n-type gate doping have been fabricated, with the buried channel devices exhibiting an effectively higher gate dielectric thickness. Given that only relatively minor modifications are needed to incorporate the buried channel taught herein into known CMOS process flows, it will also be a straightforward process to incorporate the present invention's buried channel technology into existing IC fabrications processes and existing ICs. Such modification may improve performance and decrease manufacturing cost.

Although the present invention has been described in some detail for purposes of clarity of understanding, it will be apparent that certain changes and modifications may be practiced within the scope of the appended claims. Therefore, the described embodiments should be taken as illustrative and not restrictive, and the invention should not be limited to the details given herein but should be defined by the following claims and their full scope of equivalents.

We claim:

1. An integrated circuit fabricated on a semiconductor substrate and having at least two devices, each of the devices having a different effective gate oxide thickness, the circuit comprising:
   a first device having a first gate disposed on a first gate dielectric layer, the first gate dielectric layer having a first thickness and a first effective gate oxide thickness and disposed on the semiconductor substrate; and
   a second device having a second gate disposed on a second gate dielectric layer having the first thickness and the first effective gate oxide thickness, the second gate dielectric layer fabricated on the semiconductor substrate, the second device comprising:
      a buried channel implanted below the second gate dielectric layer in a second region of the substrate, the buried channel being doped with a predetermined dopant of a first conductivity type and the second region having a second conductivity type, the buried channel having a peak concentration of the predetermined dopant positioned at a selected level in the second region below the gate dielectric layer to cause the substrate portions above the selected level to act as a supplemental gate dielectric layer when the second channel is biased with respect to the substrate and the buried channel is partially depleted of charge carriers, to increase the effective gate oxide thickness of the second device,
   wherein the level is selected so that the effective gate oxide thickness of the second device is a predetermined value greater than the first effective gate oxide thickness.

2. The integrated circuit as recited in claim 1 wherein the insulating gate dielectric layer and the substrate forms an interface and the peak concentration of implanted dopants in the buried channel is located between 400 and 1000 Angstroms below the interface.

3. The integrated circuit as recited in claim 1 wherein the device is a MOS capacitor.

4. The integrated circuit as recited in claim 1 wherein the second region of the substrate is a p-type substrate and the buried channel is an n-type buried channel.

5. The integrated circuit as recited in claim 1 wherein the second region of the substrate is an n-type substrate and the buried channel is an p-type buried channel.

6. The integrated circuit as recited in claim 1 wherein the first device has a threshold voltage implant having the same concentration and conductivity type as the predetermined dopant formed beneath the second gate and is formed in a first region of the substrate of the first conductivity type.

7. The integrated circuit as recited in claim 1 wherein the first gate is doped with a first conductivity type impurity and the second gate is doped with a second conductivity type impurity.

8. The integrated circuit as recited in claim 1 wherein the first gate is doped with a second conductivity type impurity and the second gate is doped with a first conductivity type impurity.

9. An integrated circuit fabricated on a semiconductor substrate and having at least two devices, each of the devices having a different effective gate oxide thickness, the circuit comprising:
   a first device comprising a surface channel MOS device having an insulating gate dielectric of a first thickness; and
   a second device comprising a buried channel MOS device having an insulating gate dielectric of the first thickness and a buried channel implanted into the surface region of the substrate beneath the gate, the buried channel comprising channel dopants opposite to that of the substrate dopants such that the substrate portions above the buried channel act as a supplemental gate dielectric layer when the gate is biased with respect to the substrate and the buried channel is partially depleted of charge carriers, to increase an effective gate oxide thickness of the second device to a value greater than an effective gate oxide thickness of the first device.

10. The integrated circuit as recited in claim 9 wherein the first and second devices are MOS capacitors.

11. The integrated circuit as recited in claim 9 wherein the first and second devices are one of MOS capacitors and MOS transistors.

* * * * *